(12) United States Patent
Miyamoto et al.

(10) Patent No.: US 10,838,565 B2
(45) Date of Patent: Nov. 17, 2020

(54) DISPLAY DEVICE, WITH TOUCH SENSOR, TO SUPPRESS DISCONNECTION OF LEAD-OUT WIRING

(71) Applicant: Japan Display Inc., Minato-ku (JP)

(72) Inventors: Mitsuhide Miyamoto, Minato-ku (JP); Hajime Akimoto, Minato-ku (JP); Yuko Matsumoto, Minato-ku (JP); Yusuke Tada, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/579,358

(22) Filed: Sep. 23, 2019

(65) Prior Publication Data
US 2020/0019281 A1 Jan. 16, 2020

Related U.S. Application Data

(63) Continuation of application No. PCT/JP2018/001944, filed on Jan. 23, 2018.

(30) Foreign Application Priority Data

Mar. 27, 2017 (JP) .................................. 2017-061230

(51) Int. Cl.
G06F 3/044 (2006.01)
H01L 27/32 (2006.01)
G06F 3/041 (2006.01)

(52) U.S. Cl.
CPC ............ *G06F 3/0446* (2019.05); *G06F 3/041* (2013.01); *G06F 3/0443* (2019.05);
(Continued)

(58) Field of Classification Search
CPC .... G06F 3/0443; G06F 3/0445; G06F 3/0446; G06F 3/0412; G06F 3/04103;
(Continued)

(56) References Cited

U.S. PATENT DOCUMENTS

2010/0007616 A1 1/2010 Jang
2011/0316802 A1 12/2011 Choi
(Continued)

FOREIGN PATENT DOCUMENTS

JP 2010-20315 A 1/2010
JP 2015-50245 A 3/2015
(Continued)

OTHER PUBLICATIONS

International Preliminary Report on Patentability and Written Opinion dated Oct. 1, 2019 in PCT/JP2018/001944 (English Translation only), 6 pages.
(Continued)

*Primary Examiner* — Laurence J Lee
(74) *Attorney, Agent, or Firm* — Oblon, McClelland, Maier & Neustadt, L.L.P.

(57) ABSTRACT

A display device according to an embodiment of the invention includes: a base insulating film; a sealing film which covers the base insulating film; a plurality of first electrodes which are two-dimensionally arranged on the sealing film, the first electrodes adjacent in a first direction being connected via a first connection line; a plurality of second electrodes which are two-dimensionally arranged, the second electrodes adjacent in the second direction being connected via a second connection line intersecting the first connection line in plan view; an interlayer insulating film which is interposed between the first connection line and the second connection line and which fills a step formed by an outer edge of the sealing film and the base insulating film; and a lead-out wiring which is connected to the first electrode or the second electrode and which passes over a portion of the interlayer insulating film which fills the step.

11 Claims, 14 Drawing Sheets

(52) U.S. Cl.
CPC ........ *G06F 3/0445* (2019.05); *G06F 3/04164* (2019.05); *G06F 2203/04111* (2013.01); *H01L 27/323* (2013.01)

(58) Field of Classification Search
CPC ............... G06F 3/04164; G06F 3/0416; G06F 2203/04111; G06F 2203/04103; H05B 33/04
See application file for complete search history.

(56) References Cited

U.S. PATENT DOCUMENTS

| | | |
|---|---|---|
| 2014/0167053 A1 | 6/2014 | Akiyoshi |
| 2015/0060817 A1 | 3/2015 | Sato et al. |
| 2016/0013218 A1 | 1/2016 | Akiyoshi |
| 2016/0154499 A1 | 6/2016 | Bae et al. |
| 2018/0090522 A1 | 3/2018 | Akiyoshi |

FOREIGN PATENT DOCUMENTS

| | | |
|---|---|---|
| KR | 2014-0079722 A | 6/2014 |
| KR | 2016 0065396 A | 6/2016 |

OTHER PUBLICATIONS

International Search Report dated Apr. 17, 2018 in PCT/JP2018/001944, filed Jan. 23, 2018 (with English translation).
Office Action dated Aug. 10, 2020, for corresponding KR Patent Application No. 10-2019-7027894 with computer generated English translation.

DISPLAY DEVICE, WITH TOUCH SENSOR, TO SUPPRESS DISCONNECTION OF LEAD-OUT WIRING

CROSS-REFERENCE TO RELATED APPLICATION

This application is a continuation under 35 U.S.C. 120 of International Application PCT/JP2018/001944 having the International Filing Date of Jan. 23, 2018, and having the benefit of the earlier filing date of Japanese Application No. 2017-061230, filed on Mar. 27, 2017. Each of the identified applications is fully incorporated herein by reference.

BACKGROUND OF THE INVENTION

1. Field of the Invention

One or more embodiments of the present invention relate to a display device with a touch sensor.

2. Description of the Related Art

JP2015-050245A discloses a display device incorporating a capacitive touch sensor in which a first electrode extending in an X direction in which adjacent main body portions are connected via a connection portion, and a second electrode extending in a Y direction in which adjacent main body portions are connected via a connection portion are disposed with a sealing film interposed therebetween.

SUMMARY OF THE INVENTION

By the way, the inventors of the present application are examining a way of drawing out a lead-out wiring connected to an electrode of a capacitive touch sensor to a peripheral area outside a display area. However, in that case, since the lead-out wiring needs to pass over the outer edge of a sealing film for sealing a display device, a step formed by the outer edge of the sealing film may cause disconnection of the lead-out wiring.

One or more embodiments of the present invention have been made in view of the above, an object thereof is to provide a display device with a touch sensor capable of suppressing disconnection of a lead-out wiring.

A display device according to an embodiment of the invention includes: a base insulating film; a sealing film which covers a display area of the base insulating film; a plurality of first electrodes which are two-dimensionally arranged in the display area on the sealing film, the first electrodes adjacent in a first direction being connected via a first connection line, and the first electrodes adjacent in a second direction intersecting the first direction not being connected; a plurality of second electrodes which are two-dimensionally arranged in the same layer as the first electrodes or a different layer, and which are each surrounded by the first electrodes in plan view, the second electrodes adjacent in the second direction being connected via a second connection line intersecting the first connection line in plan view, and the second electrodes adjacent in the first direction not being connected; an interlayer insulating film which is interposed between the first connection line and the second connection line and which fills a step formed by an outer edge of the sealing film and the base insulating film; and a lead-out wiring which is connected to the first electrode or the second electrode and which passes over a portion of the interlayer insulating film which fills the step.

DETAILED DESCRIPTION OF THE INVENTION

Figure 1:
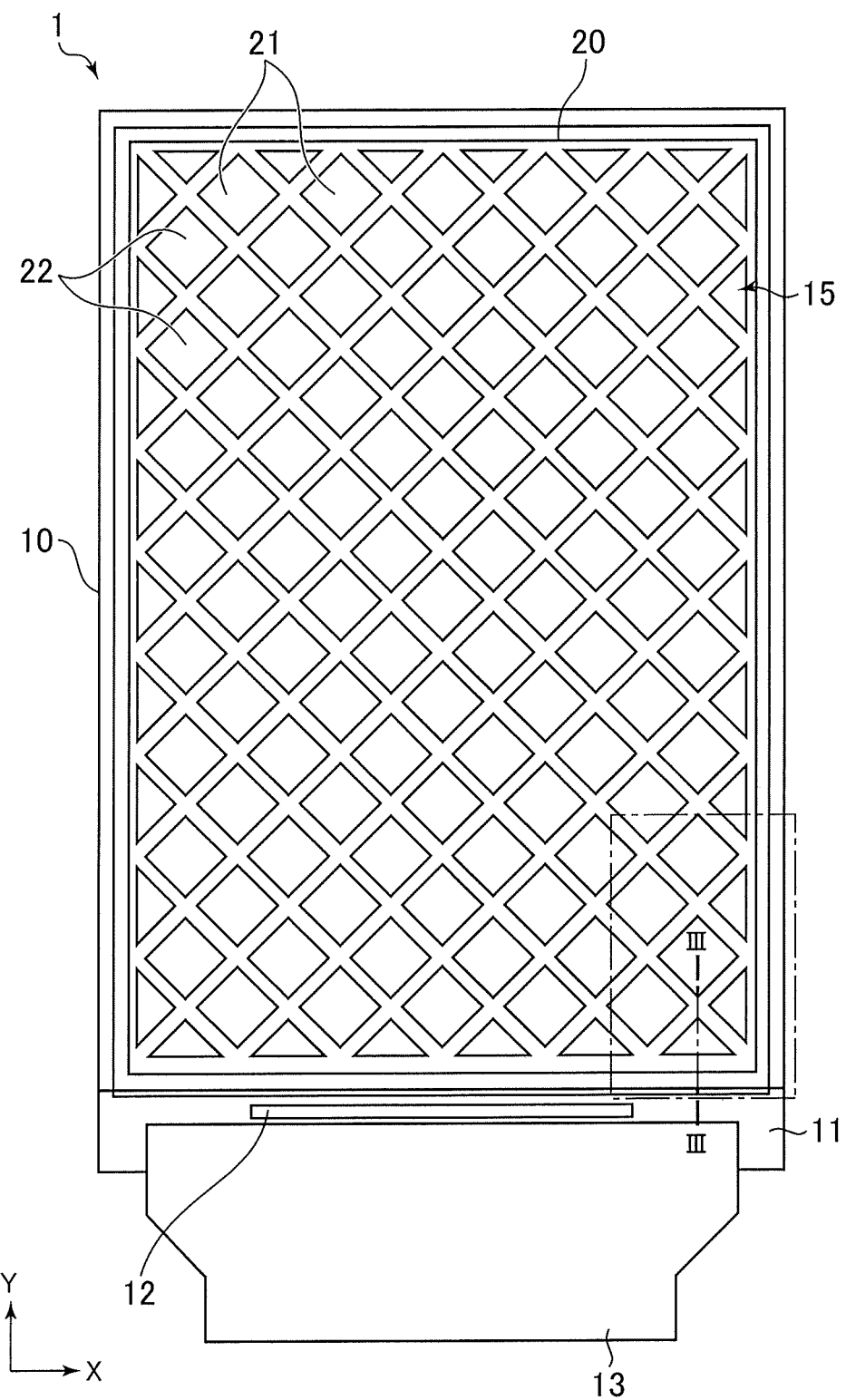
FIG. 1 is a plan view of a display device with a touch sensor according to an embodiment.

Hereinafter, embodiments of the present invention will be described with reference to drawings. The disclosure is merely an example, and appropriate modifications that those skilled in the art could easily conceive of without departing from the spirit of the invention, of course, are included in the scope of the present invention. In addition, in order to make the description clearer, the drawings may schematically represent the width, thickness, shape of each part, as compared with the embodiments, but are merely examples and do not limit the interpretation of the present invention. In the specification and the drawings, the same elements as those described above with reference to the drawings already described may be denoted by the same reference numerals, and the detailed description thereof may be appropriately omitted.

Figure 2:
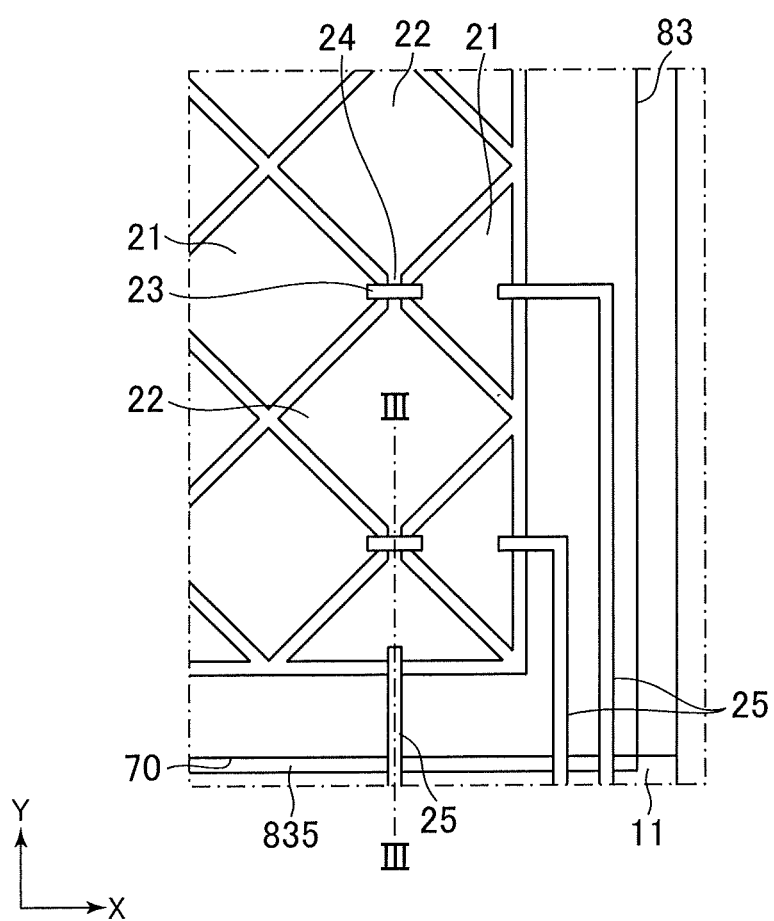
FIG. 2 is an enlarged view of a main part of FIG. 1.

FIG. 1 is a plan view of a display device with a touch sensor (hereinafter, also simply referred to as a display device) according to an embodiment. FIG. 2 is an enlarged view of the inside of a dashed-dotted line frame shown in FIG. 1. An organic EL display device is given as an example of the display device. A display device 1 forms full-color pixels by combining, for example, unit pixels (sub-pixels) of a plurality of colors of red, green, and blue to display a full-color image.

The display device 1 includes a display panel 10 and a touch sensor 20 formed on a display area 15 of the display panel 10. A peripheral area (frame area) 11 is formed outside the display area 15 of the display panel 10, and in the peripheral area 11, an integrated circuit chip 12 for driving pixels is mounted, and an FPC (flexible printed circuit) 13 for electrical connection with the outside is connected. In the following description, the direction along the side to which the FPC 13 of the peripheral area 11 is connected is taken as an X direction, and the direction orthogonal to the X direction is taken as a Y direction.

Figure 3:
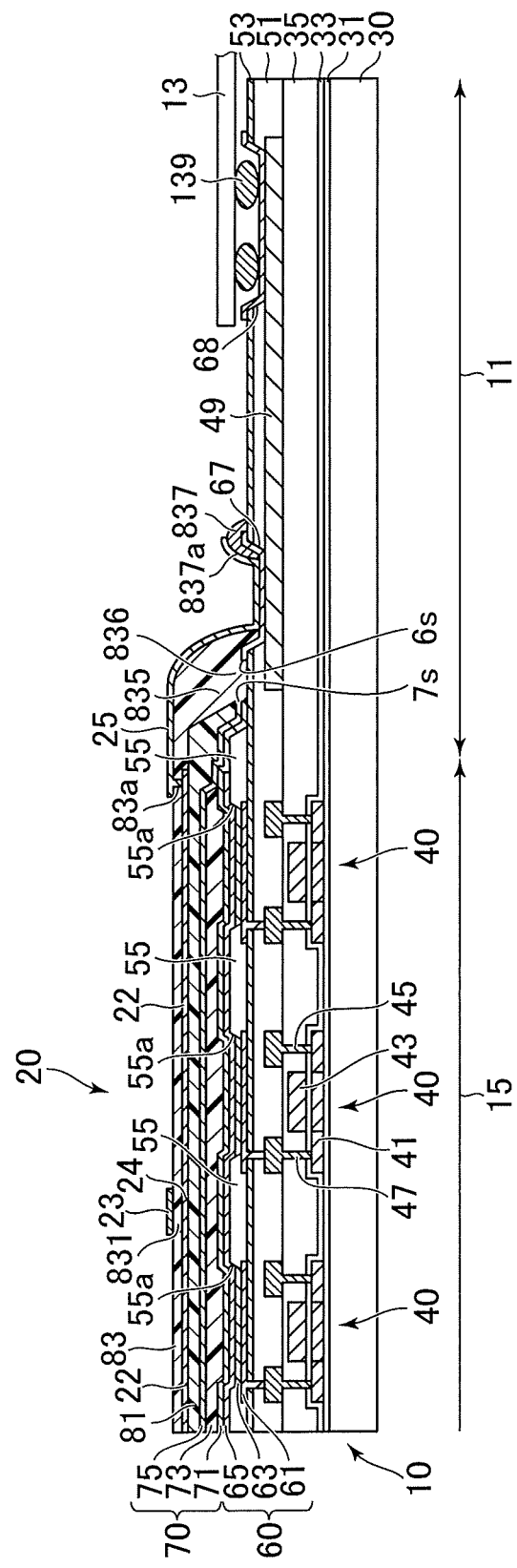
FIG. 3 is a cross-sectional view taken along the line III-III shown in FIG. 1.
Figure 4:
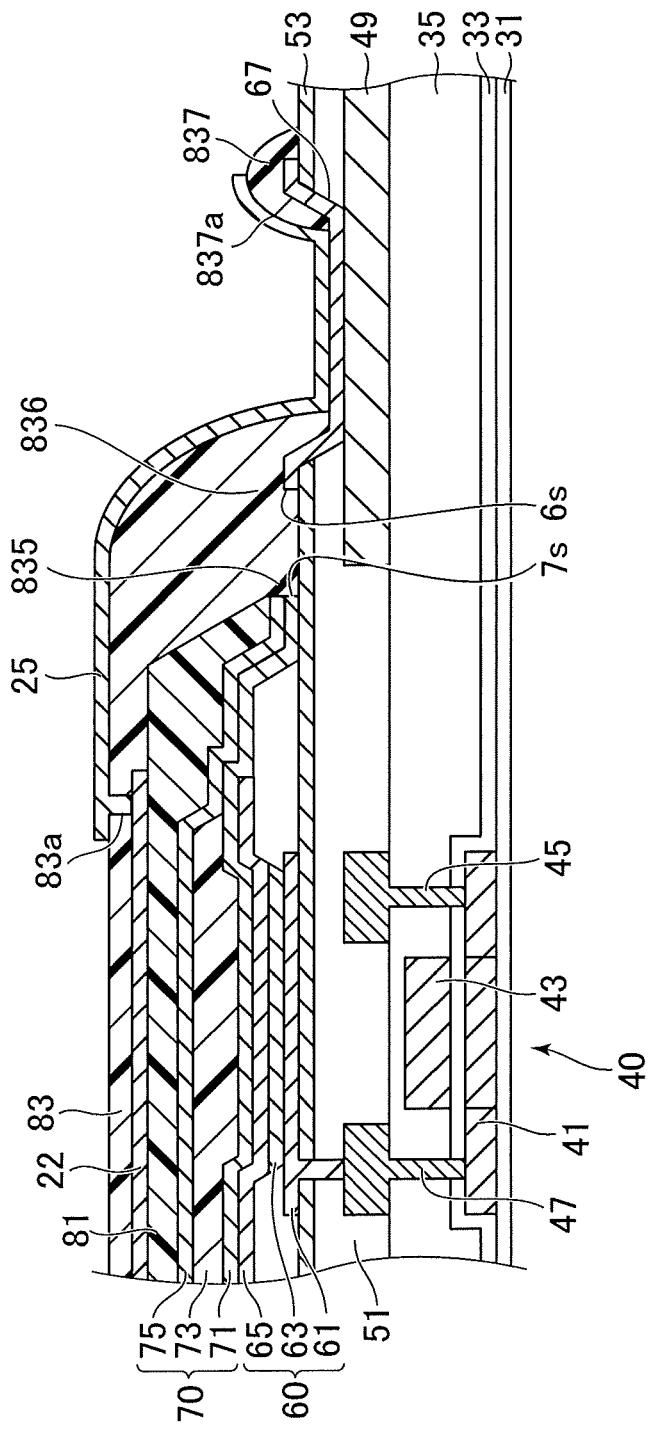
FIG. 4 is an enlarged view of a main part of FIG. 3.

FIG. 3 is a cross-sectional view taken along the line III-III shown in FIG. 1. FIG. 4 is an enlarged view of the boundary between the display area 15 and the peripheral area 11 in FIG. 3. In these drawings, hatching of some layers such as a substrate 30, a planarization film 51, and a pixel separation film 55 is omitted in order to make the cross-sectional structure more visible. In the following description, the laminating direction is an upward direction.

The substrate 30 is made of, for example, glass or a flexible resin such as polyimide. The substrate 30 is covered by an undercoat layer 31. A semiconductor layer 41 is formed on the undercoat layer 31, and the semiconductor layer 41 is covered by a gate insulating film 33. A gate electrode 43 is formed on the gate insulating film 33, and the gate electrode 43 is covered by a passivation film 35. A drain electrode 45 and a source electrode 47 are connected to the semiconductor layer 41 through the gate insulating film 33 and the passivation film 35. The semiconductor layer 41, the gate electrode 43, the drain electrode 45, and the source electrode 47 constitute a thin film transistor 40. The thin film transistor 40 is provided to correspond to each of a plurality of unit pixels. The undercoat layer 31, the gate insulating film 33, and the passivation film 35 are formed of, for example, an inorganic insulating material such as $SiO_2$, SiN, or SiON.

In addition to the drain electrode 45 and the source electrode 47, a lead-out wiring 49 is formed on the passivation film 35 in the peripheral area 11. The illustrated lead-out wiring 49 is a wire for electrically connecting the touch sensor 20 and the FPC 13. The drain electrode 45, the source electrode 47, and the lead-out wiring 49 are covered with the planarization film 51, and the planarization film 51 is covered by an interlayer insulating film 53. The drain electrode 45, the source electrode 47, and the lead-out wiring 49 are formed of a conductive material containing, for example, Al, Ag, Cu, Ni, Ti, Mo, or the like. The planarization film 51 is formed of, for example, an organic insulating material such as an acrylic resin and has a flat upper surface. The interlayer insulating film 53 is formed of, for example, an inorganic insulating material such as $SiO_2$, SiN, or SiON.

A pixel electrode 61 (for example, an anode) is formed on the interlayer insulating film 53. The pixel electrode 61 is connected to the source electrode 47 through the planarization film 51 and the interlayer insulating film 53. The pixel electrode 61 is provided to correspond to each of the plurality of unit pixels. The pixel electrode 61 is formed as a reflective electrode. Further, terminals 67 and 68 are formed in the peripheral area 11, and are penetrated through the planarization film 51 and the interlayer insulating film 53 to be connected to both ends of the lead-out wiring 49, respectively. The pixel electrode 61 and the terminals 67 and 68 are formed of a conductive material containing, for example, Al, Ag, Cu, Ni, Ti, Mo or the like. In addition, since the terminals 67 and 68 have many opportunities to be exposed to the atmosphere during the process, a material that does not easily cause surface oxidation or the like, for example, a conductive oxide such as ITO or IZO may be used. On the other hand, in a case where the display device 1 is a bottom emission type, the pixel electrode 61 needs to be formed as a transmission electrode, and also in this case, the above-described conductive oxide can be used.

The pixel electrode 61 is covered by the pixel separation film 55. The pixel separation film 55 is also called a rib or a bank. The pixel separation film 55 is formed with an opening 55a from which the pixel electrode 61 is exposed at the bottom. The inner edge portion of the pixel separation film 55 forming the opening 55a is mounted on the peripheral portion of the pixel electrode 61 and has a tapered shape which spreads outward in the upward direction. The pixel separation film 55 is formed in the vicinity of the boundary with the display area 15 in the peripheral area 11, but is not formed in other parts. The pixel separation film 55 is formed of, for example, an organic insulating material such as an acrylic resin.

Light emitting layers 63 are formed separately from each other on the pixel electrodes 61 exposed at the bottom of the openings 55a of the pixel separation films 55. The light emitting layer 63 emits light in a plurality of colors of, for example, red, green, and blue corresponding to each of the plurality of unit pixels. Along with the light emitting layer 63, at least one of a hole transport layer, a hole injection layer, an electron transport layer, and an electron transport layer may be formed. The light emitting layers 63 are formed separately from each other by vapor deposition using a mask. The light emitting layer 63 may be formed by vapor deposition as a uniform film (so-called solid film) which spreads over the entire display area 15, in that case, the light emitting layer 63 emits light in a single color (for example, white), and components of a plurality of colors, for example, red, green, and blue, are extracted by a color filter or a color conversion layer. The light emitting layer 63 is not limited to vapor deposition and may be formed by coating.

The light emitting layer 63 and the pixel separation film 55 are covered by a counter electrode 65 (for example, a cathode). The counter electrode 65 is formed as a uniform film (so-called solid film) which spreads over the entire display area 15. A light emitting element 60 is constituted by the light emitting layer 63 and the pixel electrode 61 and the counter electrode 65 sandwiching the light emitting layer 63 therebetween, and the light emitting layer 63 emits light by the current flowing between the pixel electrode 61 and the counter electrode 65. The counter electrode 65 is formed of, for example, a transparent conductive material such as ITO or a metal thin film such as MgAg. In a case where the display device 1 is a top emission type, the counter electrode 65 needs to be formed as a transmission electrode, and in a case where a metal thin film is used, the film thickness thereof needs to be made small enough to transmit light.

The pixel separation film 55 and the counter electrode 65 are sealed by being covered with a sealing film (passivation film) 70 and are shielded from moisture. The sealing film 70 has, for example, a three-layer laminated structure including an inorganic film 71, an organic film 73, and an inorganic film 75 in this order from the bottom. The inorganic films 71 and 75 are formed of, for example, an inorganic insulating material such as $SiO_2$, SiN, or SiON. The organic film 73 is formed of, for example, an organic insulating material such as an acrylic resin and planarizes the upper surface of the sealing film 70.

The outer edge of the inorganic films 71 and 75 of the sealing film 70 is in contact with the interlayer insulating film 53 outside the outer edge of the pixel separation film 55, whereby the outer edge of the inorganic films 71 and 75 and the interlayer insulating film 53 (example of the base insulating film) form a step 7s. Not limited thereto, the interlayer insulating film 53 may be omitted, and the outer edges of the inorganic films 71 and 75 may be in contact with the planarization film 51.

The display device 1 has the touch sensor 20 on the sealing film 70. Specifically, on the sealing film 70, a protective insulating film 81 is formed, a plurality of first electrodes 21 and a plurality of second electrodes 22 two-dimensionally arranged on the protective insulating film 81 are formed, and an interlayer insulating film 83 is formed on the first electrode 21 and the second electrode 22. The first electrode 21 and the second electrode 22 constitute a drive electrode and a detection electrode of a capacitive touch sensor. The protective insulating film 81 and the interlayer insulating film 83 are formed of, for example, an organic insulating material such as an acrylic resin.

In the present embodiment, the outer edge of the protective insulating film 81 coincides with the outer edge of the inorganic films 71 and 75 of the sealing film 70. This is because the protective insulating film 81 is used as a mask when selectively removing the portion covering the peripheral area 11 in the inorganic films 71 and 75. By matching the outer edge of the inorganic films 71 and 75 with the outer edge of the protective insulating film 81, the step 7s is higher and steeper. The protective insulating film 81 may be omitted.

As shown in FIGS. 1 and 2, each of the first electrode 21 and the second electrode 22 is formed in the shape of a rectangular shape, a so-called rhombus (diamond shape) in which the X direction (first direction) and the Y direction (second direction) intersecting (for example, orthogonal) the X direction make diagonal directions. Further, each of the first electrode 21 and the second electrode 22 is formed of, for example, a transparent conductive material such as ITO. Not limited thereto, the first electrode 21 and the second electrode 22 may be formed by using a conductive material such as metal. In this case, the first electrode 21 and the second electrode 22 may be formed by mesh-like wiring (mesh wiring) so as not to shield light emitted from the light emitting element 60.

The plurality of first electrodes 21 are two-dimensionally arrayed in the X direction and the Y direction, respectively. Among the first electrodes 21, the first electrodes 21 adjacent in the X direction are connected via a first connection line 23, and the first electrodes 21 adjacent in the Y direction are not connected. That is, the plurality of first electrodes 21 respectively form a plurality of electrode rows extending in the X direction by the first electrodes 21 adjacent in the X direction being connected via the first connection lines 23, and each electrode row is electrically separated in the Y direction.

The plurality of second electrodes 22 are also two-dimensionally arrayed in the X direction and the Y direction, respectively. Among the second electrodes 22, the second electrodes 22 adjacent in the Y direction are connected via a second connection line 24 intersecting the first connection line 23 in plan view, and the second electrodes 22 adjacent in the X direction are not connected. That is, the plurality of second electrodes 22 form a plurality of electrode rows extending in the Y direction by the second electrodes 22 adjacent in the Y direction being connected via the second connection line 24, and each electrode row is electrically separated in the X direction.

Each second electrode 22 is disposed to be surrounded by the first electrode 21 in plan view. For example, each second electrode 22 is disposed between the first electrodes 21 adjacent in a direction (for example, a direction of 45 degrees or −45 degrees) intersecting both the X direction and the Y direction and is surrounded by four first electrodes 21. The first electrode 21 and the second electrode 22 are electrically separated by leaving a space so as not to contact each other.

In the present embodiment, the plurality of first electrodes 21 and the plurality of second electrodes 22 are disposed in the same layer between the sealing film 70 and the interlayer insulating film 83, but the present invention is not limited thereto, and the plurality of first electrodes 21 and the plurality of second electrodes 22 may be disposed in different layers. That is, one of the first electrode 21 and the second electrode 22 may be disposed below the interlayer insulating film 83, and the other may be disposed on the interlayer insulating film 83. In addition, both the first electrode 21 and the second electrode 22 may be disposed on the interlayer insulating film 83.

The first connection line 23 and the second connection line 24 intersect in plan view. The interlayer insulating film 83 intervenes between the first connection line 23 and the second connection line 24 which intersect in plan view, and both are electrically separated. Hereinafter, in the interlayer insulating film 83, a portion interposed between the first connection line 23 and the second connection line 24 is referred to as "intervening portion 831".

In the present embodiment, the first connection line 23 is a so-called bridge wiring disposed on the interlayer insulating film 83. The first connection line 23 is connected to the first electrode 21 through a through hole formed in the interlayer insulating film 83. The first connection line 23 is formed of, for example, a conductive material containing Al, Ag, Cu, Ni, Ti, Mo or the like. On the other hand, the second connection line 24 is continuously formed with the second electrode 22 under the interlayer insulating film 83.

The present invention is not limited thereto. The second connection line 24 may be disposed on the interlayer insulating film 83 as a bridge wiring, and the first connection line 23 may be continuously formed with the first electrode 21 under the interlayer insulating film 83. In addition, the intersection where the first connection line 23 intersects the second connection line 24 as a bridge wiring and the intersection where the second connection line 24 intersects the first connection line 23 as a bridge wiring may be mixed.

As shown in FIGS. 3 and 4, the interlayer insulating film 83 fills the step 7s formed by the outer edges of the inorganic films 71 and 75 of the sealing film 70 and the interlayer insulating film 53. Hereinafter, in the interlayer insulating film 83, a portion which fills the step 7s is referred to as a "step-filling portion 835". Thus, the step-filling portion 835 fills the step 7s, whereby the upper surface of the step-filling portion 835 is flattened more than the step 7s.

The interlayer insulating film 83 is formed as a uniform film (so-called solid film) which spreads over the entire display area 15, and the intervening portion 831 interposed between the first connection line 23 and the second connection line 24, and the step-filling portion 835 filling the step 7s on the sealing film 70 side are continuously formed.

The interlayer insulating film 83 also fills the step 6s formed by the outer edge of the terminal 67 and the interlayer insulating film 53. Hereinafter, in the interlayer insulating film 83, a portion which fills the step 6s is referred to as a "step-filling portion 836". Thus, the step-filling portion 836 fills the step 6s, whereby the upper surface of the step-filling portion 836 is flattened more than the step 6s.

The step-filling portion 836 filling the step 6s on the terminal 67 side is formed continuously with the step-filling portion 835 filling the step 7s on the sealing film 70 side. Thus, the two step-filling portions 835 and 836 are formed continuously, whereby the upper surfaces of the step-filling portions 835 and 836 are more flattened. The upper surfaces of the step-filling portions 835 and 836 are gently inclined outward.

The interlayer insulating film 83 covers the terminal 67. Hereinafter, the portion of the interlayer insulating film 83 which covers the terminal 67 is referred to as a "terminal covering portion 837". The terminal covering portion 837 is formed with an opening 837a for exposing the terminal 67. The terminal covering portion 837 is formed continuously with the step-filling portion 836 filling the step 6s on the terminal 67 side.

As shown in FIGS. 2 to 4, the touch sensor 20 has a plurality of lead-out wirings 25 led out from the peripheral portion of the display area 15 to the peripheral area 11. The lead-out wiring 25 is formed simultaneously with the first connection line 23 on the interlayer insulating film 83. Each lead-out wiring 25 is connected to the first electrode 21 or the second electrode 22 through an opening 83a formed in the interlayer insulating film 83 and passes over the peripheral portion of the interlayer insulating film 83.

Specifically, the lead-out wiring 25 passes over the step-filling portions 835 and 836 in the peripheral portion of the interlayer insulating film 83 to reach the terminal covering portion 837 and is connected to the terminal 67 through the opening 837a formed in the terminal covering portion 837. The terminal 67 is the terminal 67 (first terminal) closer to the display area 15 among the two terminals 67 and 68 connected to the lead-out wiring 49 buried in the peripheral area 11.

On the other hand, the FPC 13 is connected to the terminal 68 (second terminal) separated from the display area 15 via an anisotropic conductive member 139. Further, a terminal (third terminal) (not shown) electrically connected to the light emitting element 60 is also provided in the peripheral area 11, and the FPC 13 is also connected to the terminal (not shown) via the anisotropic conductive member 139. The terminal (not shown) is electrically connected to the light emitting element 60 via, for example, the thin film transistor 40 and the integrated circuit chip 12 or the like.

In the embodiment described above, the step 7s formed by the outer edges of the inorganic films 71 and 75 of the sealing film 70 and the interlayer insulating film 53 is filled with a part (the step-filling portion 835) of the interlayer insulating film 83, and the lead-out wiring 25 is formed thereon. Therefore, as compared with the case where the step 7s is not filled with the step-filling portion 835, it is possible to suppress the disconnection or short circuit of the lead-out wiring 25.

That is, in a case where the step 7s is not filled with the step-filling portion 835, there is a possibility that the lead-out wiring 25 may cause disconnection or short circuit due to the step 7s, but in the present embodiment, the upper surface of the step-filling portion 835 is flattened compared to the step 7s by filling the step 7s with the step-filling portion 835, and therefore, it is possible to improve the process likelihood of the lead-out wiring 25 and to improve the reliability and the yield of the touch sensor 20.

Also, in the present embodiment, the step 6s formed by the outer edge of the terminal 67 and the interlayer insulating film 53 is also filled with a part (step-filling portion 836) of the interlayer insulating film 83, and the lead-out wiring 25 is formed thereon. For this reason, it is possible to suppress the disconnection of the lead-out wiring 25 as compared with the case where the step 6s is not filled with the step-filling portion 836.

Here, the step-filling portion 835 filling the step 7s on the sealing film 70 side and the step-filling portion 836 filling the step 6s on the terminal 67 side are continuously formed, and the upper surfaces of the step-filling portions 835 and 836 are more flattened. For this reason, it is possible to further improve the effect of suppressing the disconnection of the lead-out wiring 25.

In addition, in the present embodiment, the terminal 67 close to the display area 15 is covered with a part (terminal covering portion 837) of the interlayer insulating film 83, and the lead-out wiring 25 is connected to the terminal 67 through the opening 837a formed therein. According to this, since all the end portions of the lead-out wiring 25 exist on the interlayer insulating film 83, when forming the lead-out wiring 25 by etching, the amount of recession from a resist pattern can be made uniform, and the lead-out wiring 25 can be stably formed.

Furthermore, in the present embodiment, the FPC 13 is connected to both the terminal 68 (second terminal) electrically connected to the touch sensor 20 and the terminal (third terminal) (not shown) electrically connected to the light emitting element 60. Therefore, it is possible to externally supply a signal to both the touch sensor 20 and the light emitting element 60 by one FPC 13.

Figure 5:
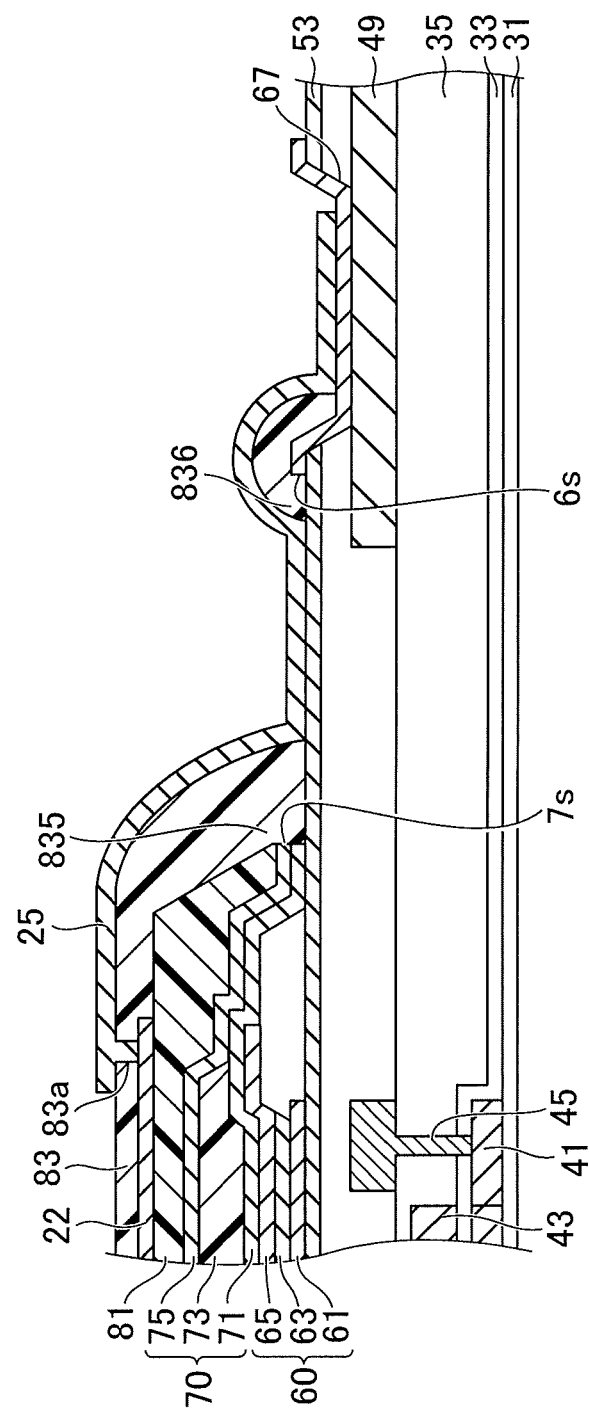
FIG. 5 is a view showing a modification example.
Figure 6:
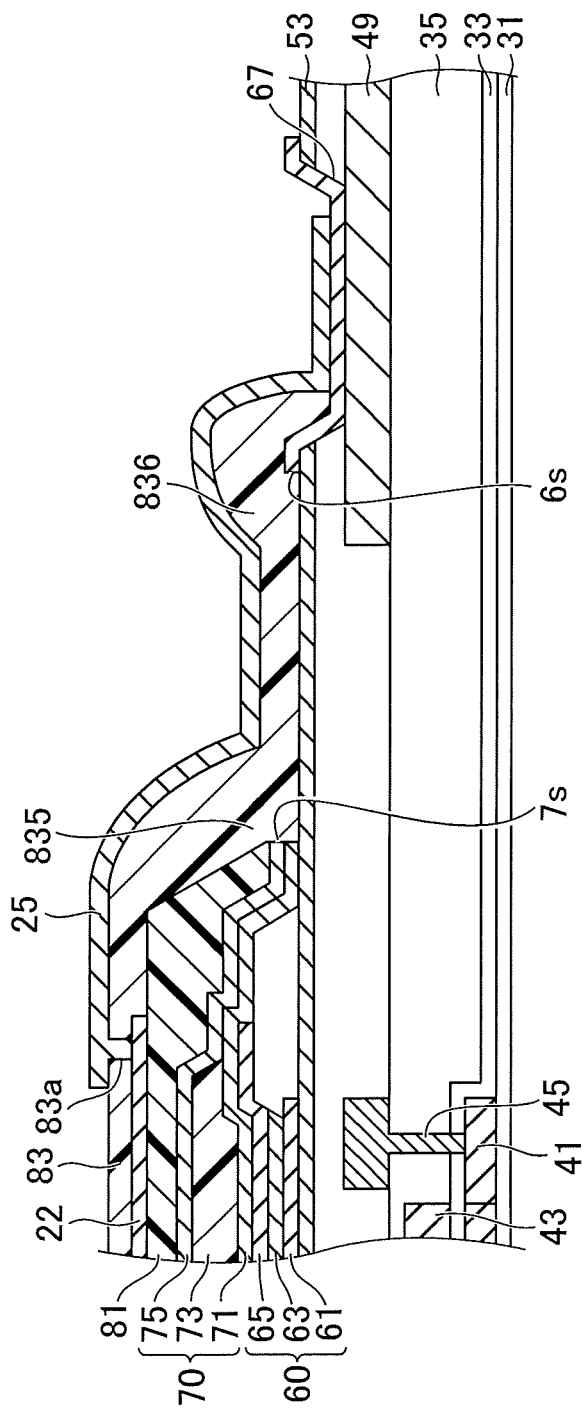
FIG. 6 is a view showing another modification example.

The present invention is not limited to the above embodiment, and as shown in FIG. 5, the step-filling portion 835 and the step-filling portion 836 may be formed separately. In this case, the lead-out wiring 25 moves from above the step-filling portion 835 onto the interlayer insulating film 53, and from above the interlayer insulating film 53 onto the step-filling portion 836. Further, as shown in FIGS. 5 and 6, the terminal covering portion 837 covering the whole of the terminal 67 may not be formed. In this case, the step-filling portion 836 covers a part of the terminal 67 on the sealing film 70 side.

Figure 7:
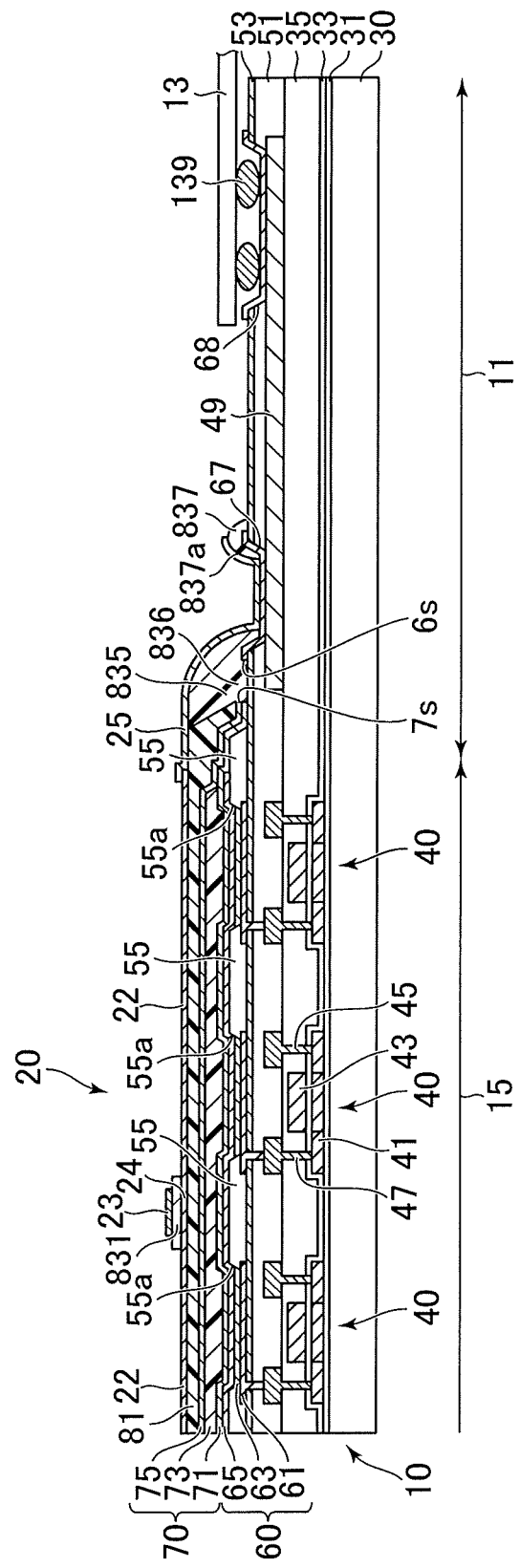
FIG. 7 is a cross-sectional view of a display device with a touch sensor according to another embodiment.
Figure 8:
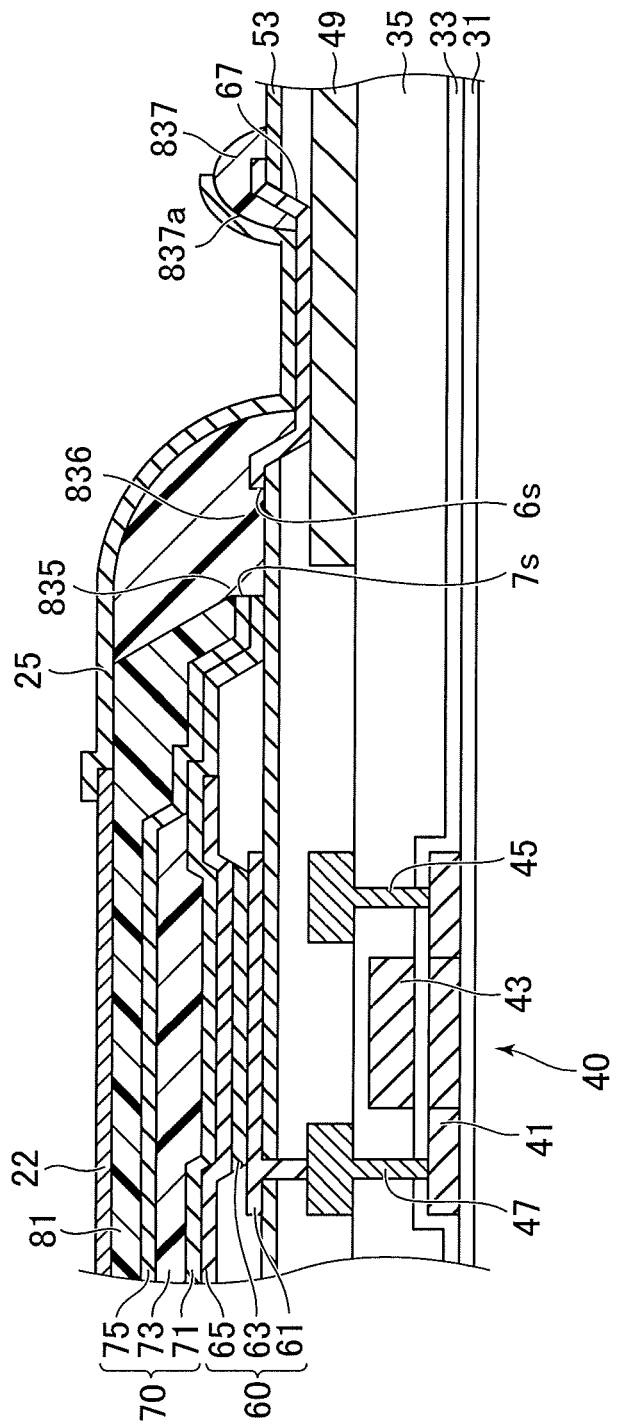
FIG. 8 is an enlarged view of a main part of FIG. 7.

FIG. 7 is a cross-sectional view of a display device with a touch sensor according to another embodiment. FIG. 8 is an enlarged view of the boundary between the display area 15 and the peripheral area 11 in FIG. 7. In the present embodiment, the interlayer insulating films 83 are separately formed at respective positions where the first connection line 23 and the second connection line 24 intersect in plan view and do not cover the first electrode 21 and the second electrode 22. That is, the intervening portions 831 are separately formed at respective positions where the first connection line 23 and the second connection line 24 intersect in plan view. In addition, the intervening portion 831 and the step-filling portion 835 are also formed separately.

The step-filling portion 835 fills the step 7s, whereby the upper surface of the step-filling portion 835 approaches the upper surface of the protective insulating film 81 and is planarized as a whole. The upper surface of the step-filling portion 835 may be aligned with the upper surface of the protective insulating film 81 or may be lower or higher than the upper surface of the protective insulating film 81. The lead-out wiring 25 moves from above the first electrode 21 or the second electrode 22 onto the protective insulating film 81, and from above the protective insulating film 81 onto the step-filling portion 835.

Also in the embodiment described above, disconnection of the lead-out wiring 25 can be suppressed. In particular, it is possible to lower the height of the step-filling portion 835 to make the inclination more gentle by separating the intervening portion 831 of the interlayer insulating film 83 and the step-filling portion 835 and forming the step-filling portion 835 to be limited to the step 7s. In addition, the external quantum efficiency can be further improved by the interlayer insulating film 83 not covering the first electrode 21 and the second electrode 22.

FIGS. 9 to 14 are views showing an example of a manufacturing process of the display device with a touch sensor according to the embodiment.

Figure 9:
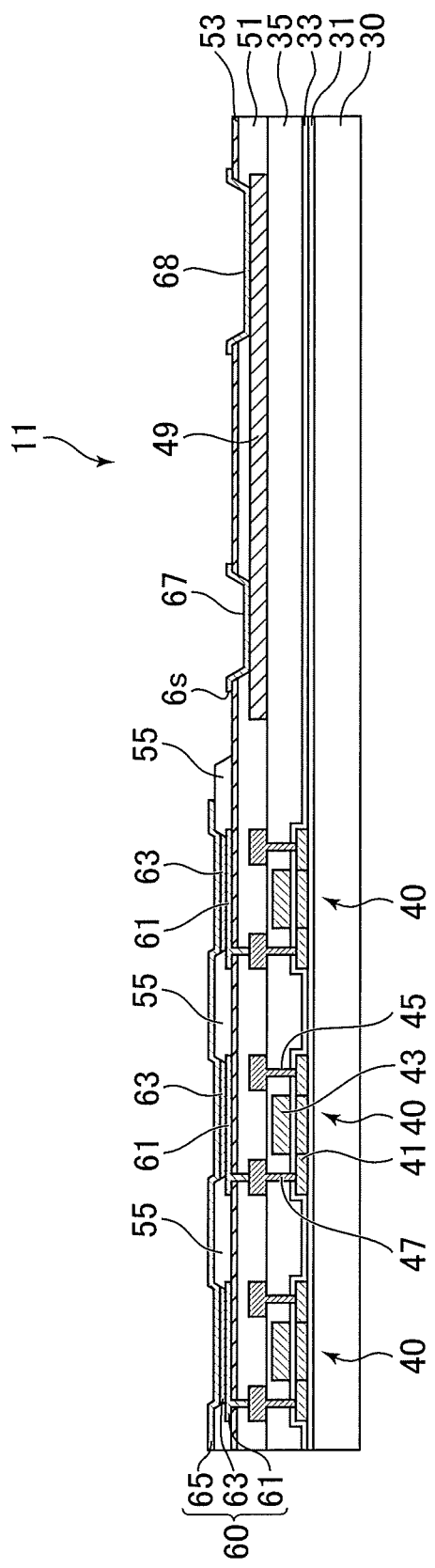
FIG. 9 is a view showing an example of a manufacturing process of the display device with a touch sensor according to the embodiment.

FIG. 9 shows a state in which the light emitting element 60 is completed. The terminals 67 and 68 are provided in the peripheral area 11, and the step 6s is formed by the outer edge of the terminal 67 and the interlayer insulating film 53. In the cross section of FIG. 9, the lead-out wiring 49 and the terminals 67 and 68 connected to the touch sensor 20 are shown, but at different positions, the counter electrode 65 of the light emitting element 60 is connected to the lead-out wiring 49 and the terminals 67 and 68.

Figure 10:
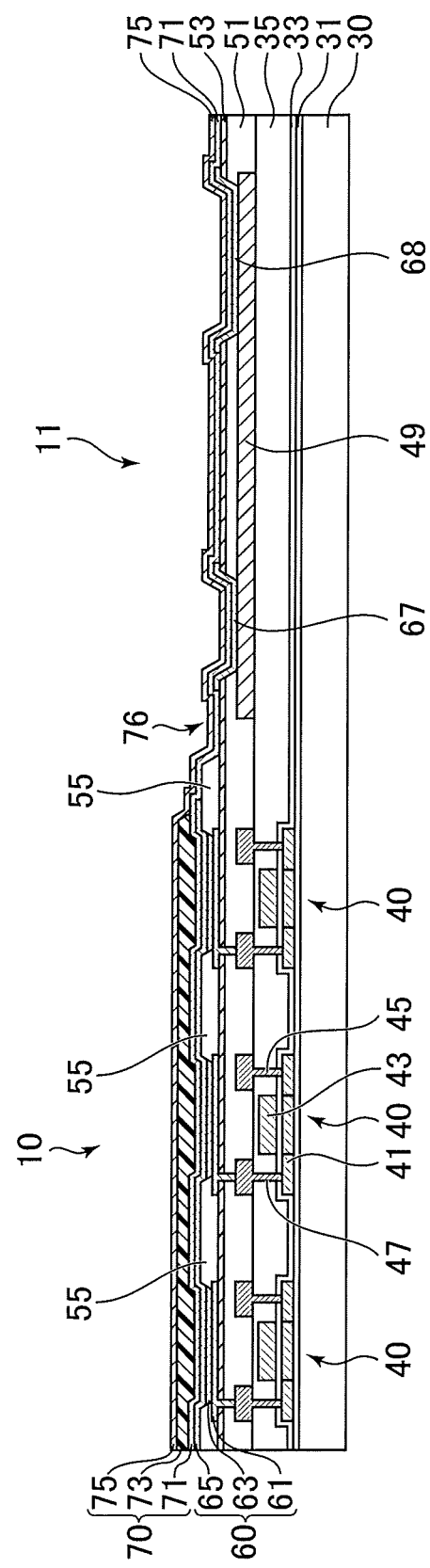
FIG. 10 is a view continued from FIG. 9.

FIG. 10 shows a process of forming the sealing film 70. Here, the organic film 73 is formed in the display area 15 and is not formed in the peripheral area 11. The organic film 73 is sealed by the two inorganic films 71 and 75 closely adhering to each other outside the outer edge of the organic film 73. For this reason, the peripheral area 11 is covered by the two inorganic films 71 and 75. Hereinafter, the two inorganic films 71 and 75 covering the peripheral area 11 will be referred to as "peripheral portion 76". The inorganic films 71 and 75 are formed, for example, by chemical vapor deposition (CVD), and the organic film 73 is formed, for example, by inkjet.

Figure 11:
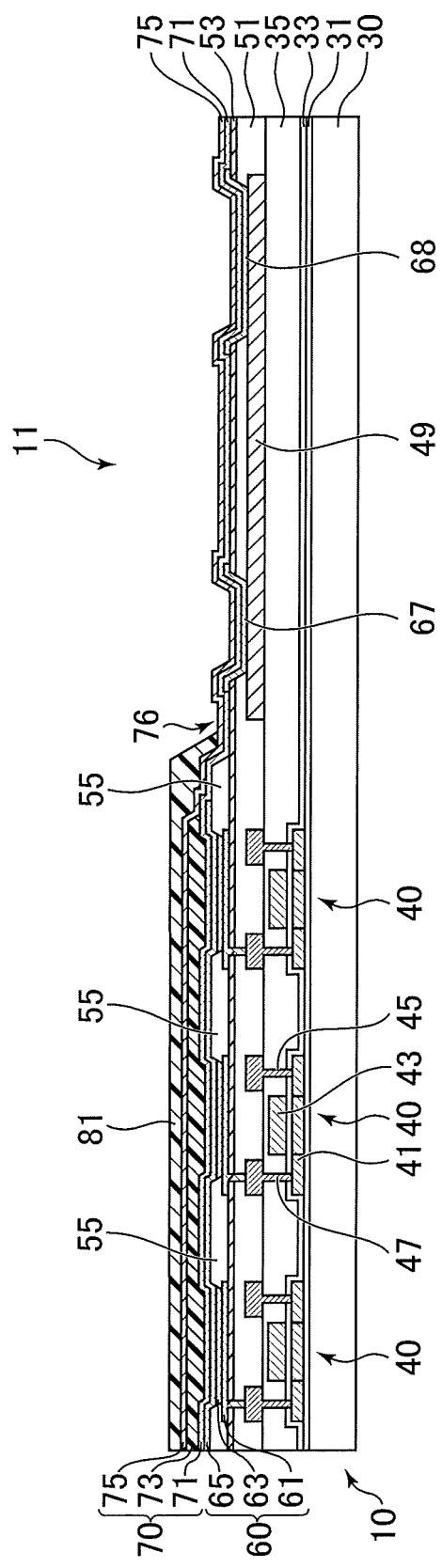
FIG. 11 is a view continued from FIG. 10.

FIG. 11 shows a process of forming the protective insulating film 81. Here, the protective insulating film 81 is formed in the display area 15 and is not formed in the peripheral area 11. Specifically, the outer edge of the protective insulating film 81 is located outside the outer edge of the pixel separation film 55. The protective insulating film 81 is formed of an organic insulating material and is used to improve the flatness in the display area 15 and to remove the peripheral portion 76 in the next step.

Figure 12:
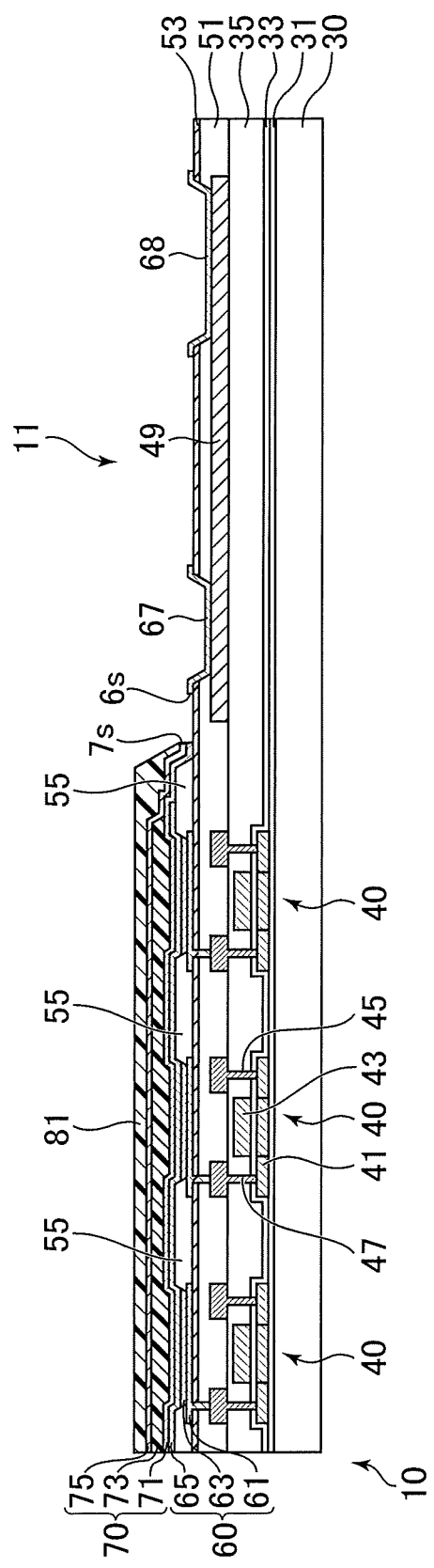
FIG. 12 is a view continued from FIG. 11.

FIG. 12 shows a process of removing the peripheral portion 76. The removal of the peripheral portion 76 is performed, for example, by dry etching using the protective insulating film 81 as a mask. Specifically, the two inorganic films 71 and 75 are cut at the outer edge of the protective insulating film 81. Since the interlayer insulating film 53 under the peripheral portion 76 is also formed of the same inorganic insulating material as the inorganic films 71 and 75, apart or all of the interlayer insulating film 53 may be simultaneously removed by the removal of the peripheral portion 76. In this case, the step 6s becomes steeper. After removing the peripheral portion 76, the protective insulating film 81 may be removed.

In the process of forming the sealing film 70, the process of forming the protective insulating film 81 and the process of removing the peripheral portion 76 may be omitted by selectively growing the inorganic films 71 and 75, for example, by CVD using a mask.

Figure 13:
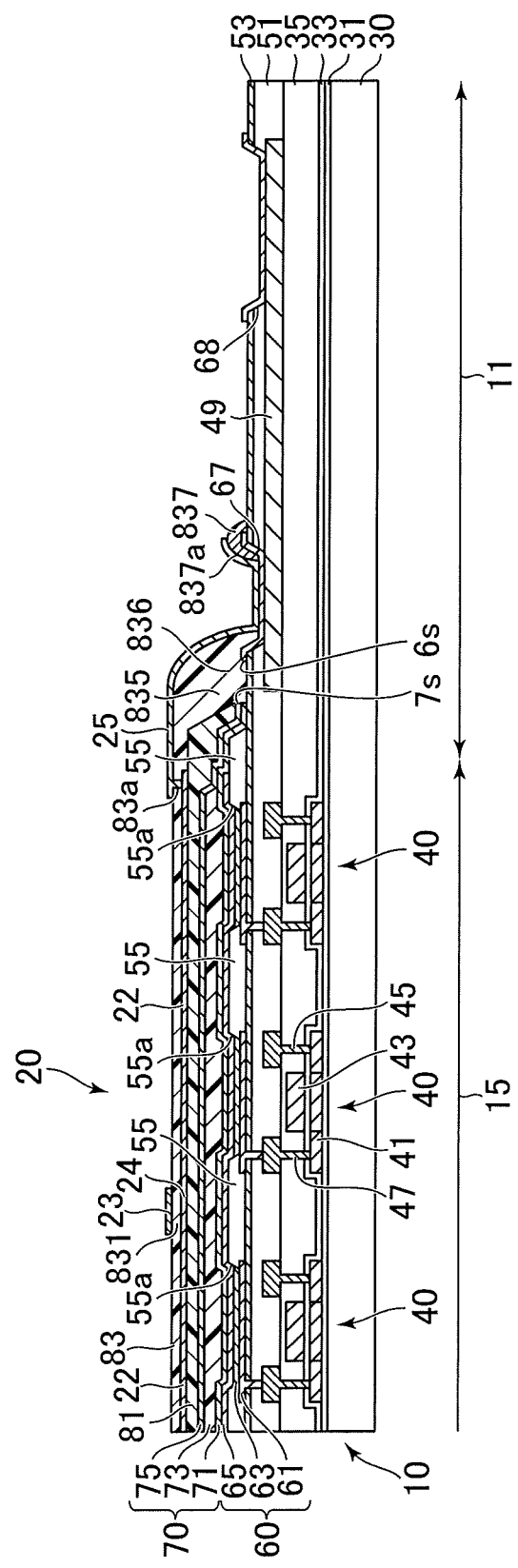
FIG. 13 is a view continued from FIG. 12.

FIG. 13 shows a process of forming the touch sensor 20. Specifically, the first electrode 21, the second electrode 22, and the second connection line 24 are formed on the protective insulating film 81, the interlayer insulating film 83 is formed thereon, and the first connection line 23 and the lead-out wiring 25 are formed thereon. The step 7s formed by the outer edge of the inorganic films 71 and 75 and the step 6s formed by the outer edge of the terminal 67 are buried by the step-filling portions 835 and 836 which are a part of the interlayer insulating film 83. The lead-out wiring 25 is formed so as to pass above the step-filling portions 835 and 836 and is connected to the terminal 67 through the opening 837a formed in the terminal covering portion 837. The interlayer insulating film 83 is formed by, for example, an inkjet or photolithography process.

Figure 14:
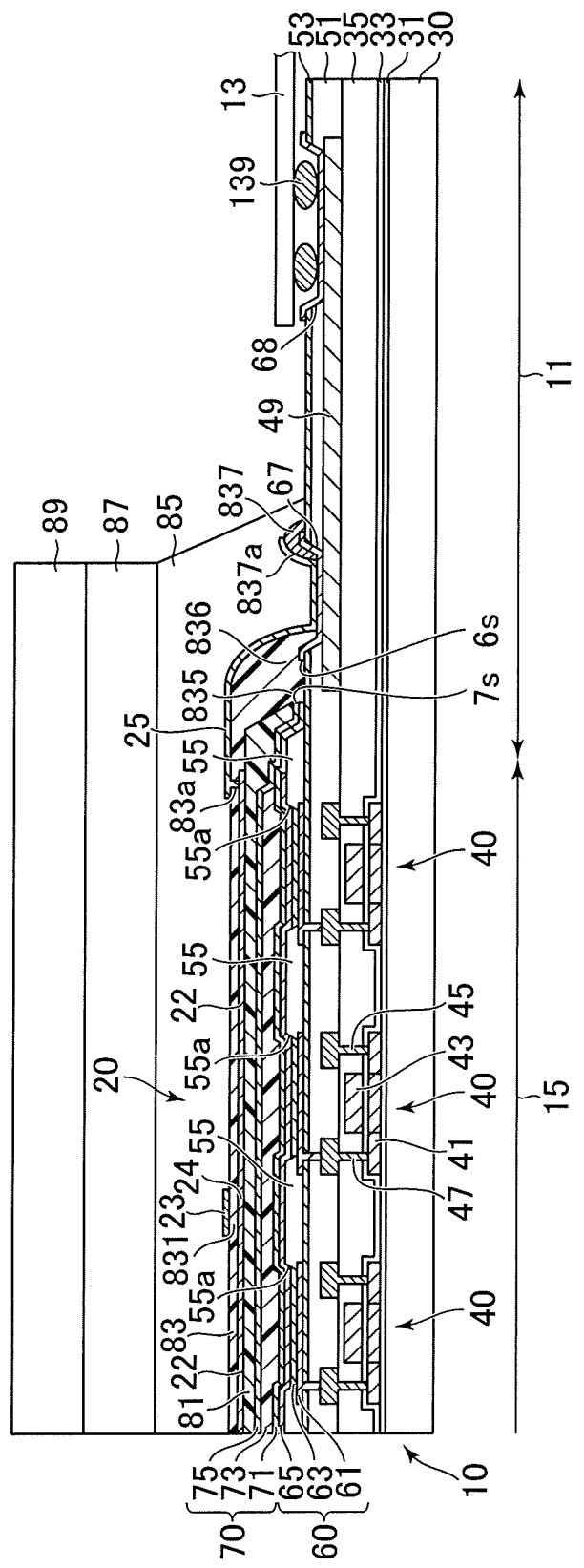
FIG. 14 is a view continued from FIG. 13.

FIG. 14 shows a process of forming a protective film 85 covering the touch sensor 20. Here, the protective film 85 is formed so as to cover the entire touch sensor 20 and further the lead-out wiring 25 and the terminal 67. The protective film 85 is formed of, for example, an organic insulating material such as an acrylic resin. A circularly polarizing film 87 may be disposed on the protective film 85. A cover film 89 may be disposed on the circularly polarizing film 87. Further, the FPC 13 is connected to the terminal 68 not covered by the protective film 85 via the anisotropic conductive member 139.

In the embodiment described above, the case where the touch sensor 20 includes the first electrode 21 and the second electrode 22 that constitute a drive electrode and a detection electrode of a capacitive touch sensor is illustrated, but the touch sensor 20 may further include an electrode for realizing a pressure-sensitive function in addition to these electrodes.

In the present embodiment, the case of the organic EL display device is illustrated as a disclosed example, but as another application example, any flat panel type display devices such as a liquid crystal display device, another self-luminous display device, or an electronic paper type display device having an electrophoretic element or the like can be mentioned. Further, it is needless to say that the invention can be applied to medium to small-sized and large-sized display devices without particular limitation.

It will be understood by those skilled in the art that various changes and modifications can be made within the scope of the concept of the present invention, and such changes and modifications are also considered to fall within the scope of the present invention. For example, it is within the scope of the present invention that those skilled in the art may appropriately add, delete, or redesign the components or add or omit a process or change the conditions with respect to the above-described embodiments as long as the gist of the present invention is included.

What is claimed is:

1. A display device comprising:
   a base insulating film;
   a sealing film which covers a display area of the base insulating film;
   a plurality of first electrodes which are two-dimensionally arranged in the display area on the sealing film, the first electrodes adjacent in a first direction being connected via a first connection line, and the first electrodes adjacent in a second direction intersecting the first direction not being connected;
   a plurality of second electrodes which are two-dimensionally arranged in the same layer as the first electrodes or a different layer, and which are each surrounded by the first electrodes in plan view, the second electrodes adjacent in the second direction being connected via a second connection line intersecting the first connection line in plan view, and the second electrodes adjacent in the first direction not being connected;
   an interlayer insulating film which is interposed between the first connection line and the second connection line and which fills a step formed by an outer edge of the sealing film and the base insulating film; and
   a lead-out wiring which is connected to the first electrodes or the second electrodes and which passes over a portion of the interlayer insulating film which fills the step.

2. The display device according to claim 1, wherein
   the interlayer insulating film is a film formed by continuously forming a portion interposed between the first connection line and the second connection line and a portion filling the step.

3. The display device according to claim 1, wherein
   the interlayer insulating film is a film formed by separating a portion interposed between the first connection line and the second connection line and a portion filling the step.

4. The display device according to claim 1, further comprising:
- a pixel electrode which is formed between the base insulating film and the sealing film and disposed in the display area on the base insulating film; and
- a pixel separation film which covers a peripheral portion of the pixel electrode and is formed with an opening with a top surface of the pixel electrode at the bottom, wherein
- the outer edge of the sealing film is in contact with the base insulating film outside the outer edge of the pixel separation film.

5. The display device according to claim 1, further comprising:
- a protective insulating film which is formed between the sealing film and the first electrodes or the second electrodes, wherein
- the outer edge of the sealing film coincides with an outer edge of the protective insulating film.

6. The display device according to claim 1, wherein
the lead-out wiring is connected to a first terminal provided in a peripheral area outside the display area of the base insulating film.

7. The display device according to claim 6, wherein
the interlayer insulating film fills another step formed by an outer edge of the first terminal and the base insulating film, and
the lead-out wiring passes over a portion of the interlayer insulating film which fills the other step.

8. The display device according to claim 7, wherein
a portion of the interlayer insulating film which fills the step and a portion of the interlayer insulating film which fills the other step are continuous.

9. The display device according to claim 6, wherein
the interlayer insulating film covers the first terminal, and
the lead-out wiring is connected to the first terminal through an opening formed in a portion covering the first terminal of the interlayer insulating film.

10. The display device according to claim 6, further comprising:
- a flexible substrate which is provided in the peripheral area and is connected to a second terminal electrically connected to the first terminal.

11. The display device according to claim 10, wherein
the flexible substrate is provided in the peripheral area and is also connected to a third terminal electrically connected to a pixel electrode disposed in the display area.

* * * * *